(12) United States Patent
Kaindl

(10) Patent No.: US 12,212,373 B2
(45) Date of Patent: Jan. 28, 2025

(54) INTERMODULATION MEASUREMENT METHOD, INTERMODULATION MEASURING APPARATUS AND COMPUTER PROGRAM FOR ASCERTAINING AN INTERMODULATION SOURCE IN A TRANSMISSION LINK

(71) Applicant: Rosenberger Hochfrequenztechnik GmbH & Co. KG, Fridolfing (DE)

(72) Inventor: Benjamin Kaindl, Fridolfing (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 18/140,220

(22) Filed: Apr. 27, 2023

(65) Prior Publication Data

US 2024/0022339 A1  Jan. 18, 2024

(30) Foreign Application Priority Data

Apr. 27, 2022  (EP) .................................... 22170194

(51) Int. Cl.
  *H04B 17/00* (2015.01)
  *H04B 17/17* (2015.01)
(52) U.S. Cl.
  CPC ......... *H04B 17/0085* (2013.01); *H04B 17/17* (2015.01)
(58) Field of Classification Search
  CPC ............ H04B 17/0082; H04B 17/0085; H04B 17/0087; H04B 17/10; H04B 17/11;
  (Continued)

(56) References Cited

U.S. PATENT DOCUMENTS 8,354,956 B2 * 1/2013 Matyas ................ H01Q 25/007
    343/781 R
9,279,845 B2 * 3/2016 Armbrecht ........... G01R 29/105
    (Continued)

FOREIGN PATENT DOCUMENTS

DE  10 2015 212278 A1   1/2017
WO     2021217214 A1  11/2021

OTHER PUBLICATIONS

European Search Report dated Oct. 24, 2022.
Application Note, IMD Measurements Using Dual Source and Multiple Source Control, Anritsu. May 2015.

*Primary Examiner* — James M Perez
(74) *Attorney, Agent, or Firm* — Randall Danskin P.S.

(57) ABSTRACT

A method for ascertaining an Intermodulation source by measuring intermodulation in a transmission link having the steps of simultaneously supplying a first and second test signals to the transmission link; measuring an output signal from the transmission link in response to the supplied test signals and analyzing the output signal in a discrete frequency spectrum to determine an intermodulation signal level ($P_{PIM}$) at a discrete intermodulation frequency ($f_{PIM}$), the measurement frequency range of the frequency spectrum having at least the signal level ($P_{0 \ldots n}$) associated with a further discrete measurement frequency ($f_{0 \ldots n}$).

19 Claims, 3 Drawing Sheets

(58) Field of Classification Search
CPC ........ H04B 17/14; H04B 17/15; H04B 17/17; H04B 17/18; H04B 17/20; H04B 17/29; H04B 17/294; H04B 17/295
See application file for complete search history.

(56) References Cited

U.S. PATENT DOCUMENTS

| | | | | |
|---|---|---|---|---|
| 9,331,726 | B2* | 5/2016 | Entsfellner | H04L 27/04 |
| 9,768,812 | B1* | 9/2017 | Tsui | H04B 17/0085 |
| 9,801,082 | B2* | 10/2017 | Entsfellner | G01R 27/32 |
| 9,942,784 | B2* | 4/2018 | Entsfellner | G01R 35/005 |
| 9,977,068 | B1* | 5/2018 | Bradley | H04B 17/14 |
| 10,237,001 | B2* | 3/2019 | Schwab | H04B 17/17 |
| 10,270,546 | B2* | 4/2019 | Entsfellner | H04B 3/46 |
| 10,302,538 | B2* | 5/2019 | Schwab | G01N 3/30 |
| 10,345,438 | B2* | 7/2019 | Gander | G01S 11/023 |
| 10,404,000 | B2* | 9/2019 | Gruber | H01R 13/2421 |
| 10,637,567 | B1* | 4/2020 | Bradley | G01R 23/20 |
| 10,644,466 | B2* | 5/2020 | Qin | H01R 9/05 |
| 10,911,163 | B2* | 2/2021 | Chen | H04B 17/17 |
| 11,108,475 | B2* | 8/2021 | Chapman | H04B 7/0617 |
| 11,757,543 | B2* | 9/2023 | Chervyakov | H04B 17/345 370/252 |
| 11,862,913 | B2* | 1/2024 | Wild | H01R 25/006 |
| 11,997,512 | B2* | 5/2024 | Li | H04B 17/29 |
| 12,057,892 | B2* | 8/2024 | Chervyakov | H04W 24/06 |
| 12,063,537 | B2* | 8/2024 | Li | H04B 17/29 |
| 2003/0232600 | A1* | 12/2003 | Montgomery | H01Q 21/26 455/562.1 |
| 2007/0161288 | A1* | 7/2007 | Entsfellner | H01R 13/6277 439/578 |
| 2009/0053928 | A9* | 2/2009 | Entsfellner | H01R 13/6277 439/578 |
| 2009/0262037 | A1* | 10/2009 | Matyas | H01Q 19/17 343/779 |
| 2012/0146861 | A1* | 6/2012 | Armbrecht | G01R 29/0828 343/703 |
| 2013/0182753 | A1* | 7/2013 | Delforce | G01R 23/20 375/228 |
| 2015/0318879 | A1* | 11/2015 | Entsfellner | H04L 27/04 375/300 |
| 2016/0028497 | A1* | 1/2016 | Holt | H04B 17/26 375/228 |
| 2016/0187243 | A1* | 6/2016 | Schwab | G01M 7/08 73/12.09 |
| 2016/0316422 | A1 | 10/2016 | Regan | |
| 2016/0366605 | A1* | 12/2016 | Tsui | H04W 24/08 |
| 2017/0126337 | A1* | 5/2017 | Schwab | H04L 27/12 |
| 2017/0176507 | A1* | 6/2017 | O'Keeffe | H04B 17/19 |
| 2017/0230129 | A1* | 8/2017 | Yoo | H04B 17/11 |
| 2017/0237484 | A1* | 8/2017 | Heath | H04B 10/07953 398/26 |
| 2017/0271827 | A1* | 9/2017 | Qin | H01R 9/05 |
| 2017/0302390 | A1* | 10/2017 | Entsfellner | H04B 3/46 |
| 2018/0081047 | A1* | 3/2018 | Gander | H04B 17/0085 |
| 2018/0219636 | A1* | 8/2018 | Gale | H04B 17/0085 |
| 2018/0241485 | A1* | 8/2018 | Velasquez | H04B 1/1027 |
| 2019/0173593 | A1* | 6/2019 | Chapman | H04B 17/12 |
| 2019/0273564 | A1* | 9/2019 | Vella-Coleiro | G01R 23/20 |
| 2020/0067613 | A1* | 2/2020 | Reynolds | H04B 17/345 |
| 2020/0106534 | A1* | 4/2020 | Chen | H04B 17/17 |
| 2021/0203422 | A1* | 7/2021 | Gale | H01Q 3/267 |
| 2022/0109275 | A1* | 4/2022 | Wild | H05K 1/182 |
| 2022/0109515 | A1* | 4/2022 | Chervyakov | H04B 17/21 |
| 2022/0132349 | A1* | 4/2022 | Li | H04B 7/0417 |
| 2022/0141684 | A1* | 5/2022 | Li | H04W 56/001 370/337 |
| 2023/0243879 | A1* | 8/2023 | Bailey | H04B 17/29 343/700 R |
| 2024/0022056 | A1* | 1/2024 | Nunez | F16L 3/22 |
| 2024/0022339 | A1* | 1/2024 | Kaindl | H04B 17/0085 |
| 2024/0323711 | A1* | 9/2024 | Li | H04B 17/17 |

\* cited by examiner

INTERMODULATION MEASUREMENT METHOD, INTERMODULATION MEASURING APPARATUS AND COMPUTER PROGRAM FOR ASCERTAINING AN INTERMODULATION SOURCE IN A TRANSMISSION LINK

CROSS-REFERENCE TO RELATED APPLICATIONS

This US National Stage Non-Provisional Patent Application claims priority to earlier filed European Patent Application No. 20 170 194.9 which was filed on 27 Apr. 2022. The entire contents of the aforementioned earlier filed European Patent Application Is expressly and fully incorporated herein by this reference.

Pursuant to USPTO rules, this priority claim to earlier filed European Patent Application No. 20 170 194.9 which was filed on 27 Apr. 2022 is also included in the Application Data Sheet (ADS) flied herewith.

FIELD OF INVENTION

The invention relates to an intermodulation measurement method for ascertaining an intermodulation source by means of intermodulation measurement in a transmission link, in particular for ascertaining a passive intermodulation source in a mobile radio transmission link.

The invention also relates to a computer program for carrying out the method.

The invention further relates to an intermodulation measuring apparatus for ascertaining an intermodulation source by means of intermodulation measurement in a transmission link, in particular for ascertaining a passive intermodulation source in a mobile radio transmission link, comprising a test signal generator and a measuring device.

BACKGROUND OF THE INVENTION

Intermodulation (IM) refers to the emergence of frequencies ("intermodulation frequencies" below) as a result of non-linear superimposition of two or more signal frequencies in a transmission link. Intermodulations arise inter alia in transmission links associated with communications engineering and are generally undesirable. In principle, any non-linear parts or components can be such intermodulation sources.

In particular passive intermodulation sources are often problematic in a transmission link. When a radio-frequency transmission signal is transmitted via a transmission link (e.g. via a transmission link having an antenna, a plug connector, a cable, a filter, etc.), harmonics or intermodulation products are generated at non-linear transmission points, or transmission elements, and are superimposed on the wanted signal as interference signal components. The influence of this so-called passive intermodulation (PIM) is increasingly relevant in particular in mobile radio engineering. By way of example, passive intermodulation sources may be able to be attributed to mechanical instabilities in the antennas, plug connectors, cables and filters (e.g. "loose connections"). PIM signals are generated in particular by plug-in connections and RF signal cables within a mobile radio transmission link. Defective terminating resistors, corroded plug connectors, bad solder joints or loose screw connections owing to poorly performed installation, weather conditions and/or ageing of the parts are the most relevant passive Intermodulation sources.

Inadequately or poorly designed components of a transmission link may also be a (passive) Intermodulation source.

Finally, passive Intermodulation leads to increased background noise and thus ultimately lowers the performance and quality of mobile radio. Undetected intermodulation sources can develop into a massive interference factor in mobile radio operation because the effects become noticeable in particular in the case of data traffic at high data rates.

The problem with superimposing an RF wanted signal with a PIM signal is the fact that the nonlinearity of the intermodulation source means that the timing of the occurrence and the signal level of the PIM signal can vary stochastically. Compensating for non-linear PIM Interference in the transmission signal by means of standard equalization methods therefore typically does not deliver good results.

Against this background, it is known practice to use an Intermodulation measurement to ascertain the occurrence of intermodulation sources and to rate the effect thereof in the transmission link for admissibility. If the influence of the intermodulation source is too great, the intermodulation source should be eliminated. During intermodulation measurement, it is therefore Initially established whether a relevant intermodulation source is present in the transmission link. The intermodulation source, if applicable, can then be identified, or located in the transmission link, and at best eliminated, or the influence thereof can be reduced to an acceptable level.

To ascertain the intermodulation sources, two RF carriers, or test signals, each having a different test signal frequency ($f_1$, $f_2$ below), are generally applied to the transmission link and the existence and level of a potential intermodulation source are ascertained by way of a level measurement for the reflected intermodulation product at a specific intermodulation frequency. The relationship $f_{IM} = \pm m \cdot f_1 \pm n \cdot f_2$ can be used to determine the intermodulation products $f_{IM}$ of the respective order (m+n). The recorded signal level can then be tested for an admissible value by comparing it with a threshold value.

Intermodulation sources cannot be detected under controlled laboratory conditions in all cases, however, but rather are regularly detected in the range of influence of potential interference sources (e.g. mobile phones) and sometimes even "in the field", or at the intended place of use of the transmission link, i.e. for example on a mobile radio mast. The measured output signal for the intermodulation measurement is therefore usually superimposed with different interference that can distort the result of the measurement. Possible interference sources are for example (stochastic) noise, interference from multiple intermodulation sources and a distortion of the PIM signal. The fundamental problem, however, can be seen in real (mobile) radio signals, which, by nature, may be in the frequency range of the intermodulation measurement. The duration, the power or signal level and the bandwidth of mobile radio signals are dependent on the mobile radio standard used and on the current mobile radio traffic and are therefore not predictable during intermodulation measurement—and are also unavoidable during measurements in the field, in particular if the antenna cannot or must not be removed from the transmission link to be examined.

The interference, or superimpositions, can therefore adversely affect the intermodulation measurement and lead to an incorrectly detected intermodulation source. The search for errors or intermodulation sources is therefore extraordinarily complex and is sometimes not reliably possible.

In light of the known prior art, the object of the present invention is to provide an intermodulation measurement method that facilitates reliable ascertainment of intermodulation sources in a transmission link, with preferably good distinguishability from other interference or superimpositions in the transmission link.

The present invention is also based on the object of providing a computer program for carrying out an improved intermodulation measurement method that facilitates reliable ascertainment of intermodulation sources in a transmission link.

Moreover, it is an object of the invention to provide an intermodulation measuring apparatus that facilitates reliable ascertainment of intermodulation sources in a transmission link, with preferably good distinguishability from other interference or superimpositions in the transmission link.

The claims and the features described herein relate to advantageous embodiments and variants of the invention.

There is provision for an intermodulation measurement method, for ascertaining an intermodulation source by means of intermodulation measurement in a transmission link, in particular for ascertaining a passive intermodulation source in a mobile radio transmission link.

The invention's ascertainment of the intermodulation source can involve in particular establishing whether an intermodulation source, or an intermodulation source that is relevant to the transmission link, is present or is not present. In principle, however, the invention's ascertainment of the intermodulation source can also (alternatively or additionally) be understood to mean the identification or location of the Intermodulation source.

The disclosed method is particularly suitable for ascertaining a passive intermodulation source in a transmission link, in particular in a mobile radio transmission link. However, the Invention may be suitable for ascertaining any intermodulation source, that is to say for example also for ascertaining an intermodulation source that can be attributed to an active electronic device, for example to a faulty non-linear device operating outside the envisaged specifications.

The method according to the invention comprises at least the method steps of: supplying (in particular simultaneously supplying) a first test signal and a second test signal to the transmission link; and measuring an output signal from the transmission link in response to the supplied test signals.

There may in particular be provision for two test signals having a high power sufficient for good detectability during a measurement to be supplied on defined test frequencies to the line, or transmission link, to be tested. If said test signals encounter the nonlinear intermodulation source, mixing occurs that involves intermodulation frequencies being generated. Measuring the output signal allows the intermodulation signal level (in particular amplitude, or signal voltage or signal power) of the resultant PIM signal to be recorded. That is to say that if signal levels above a specific threshold value are recorded at the intermodulation frequencies during the measurement process, the measurement engineer is preferably able to take measures to precisely locate the intermodulation source and to correct the problem.

In principle, any number of test signals can be supplied to the transmission link. Generally, however, it is sufficient to use precisely two test signals (referred to as the "first test signal" and the "second test signal" in the present instance) to ascertain an intermodulation source. For the purpose of generating the test signals, there can be provision for the test signal generator.

The output signal can be measured by way of a measuring device. The output signal is preferably measured in the time domain over a defined period, preferably over the same period in which the test signals are supplied.

A difficulty of the intermodulation measurement can regularly be seen in the exact locating of the intermodulation source. There may therefore optionally be provision for the transmission link to be supplied with a mechanical stimulus (e.g. tapping or bending electronic components and RF connecting points) while the test signals are supplied, or while the output signal is measured. If the mechanically stimulated electronic component or connecting point then generates an excessively high PIM level that cannot be measured without the stimulation, the respective intermodulation source has been successfully identified and can be replaced or repaired. This makes it possible to ensure that the RF infrastructure of the transmission link is loadable during operation and can be operated correctly, even if it is subject to extreme weather conditions.

According to the invention, there is provision for the measured output signal to be analyzed in a discrete frequency spectrum in order to determine the intermodulation signal level at a discrete intermodulation frequency.

A "signal level", for example the aforementioned "intermodulation signal level", can be understood within the context of the present invention to mean in particular a spectral value from which the absolute value or the square (power) has been ascertained (if applicable, a representation as a vector, that is to say absolute value and phase, is also possible, however). In particular, the "signal level" can be a power level. In principle, however, a signal level in the time domain is also possible within the context of the invention (in particular an amplitude, such as a signal voltage).

The output signal can be analyzed in particular by means of the control device that will be mentioned below, which initially uses the temporal measurement signals associated with the output signal to calculate the discrete frequency spectrum and then records the signal level, or the intermodulation signal level, at the intermodulation frequency that is expected, or is to be analyzed.

The aforementioned analysis of the frequency spectrum during the intermodulation measurement, or while the test signals are supplied, is preferably performed in part during the intermodulation measurement, or in part while the test signals are supplied, or after the intermodulation measurement, or after the test signals have been supplied. The invention does not generally have provision for the frequency spectrum to be analyzed even before the test signals are supplied, but this is optionally likewise possible as an addition, for example in order to Inspect the active signal frequencies in the measurement frequency range to be examined before the actual intermodulation measurement and analysis.

The aforementioned analysis in the frequency spectrum is preferably performed in automated or at least semiautomated fashion, using said control device.

According to the invention, there is provision for the measurement frequency range of the frequency spectrum to be stipulated such that the frequency spectrum has at least the signal level associated with a further discrete measurement frequency.

The frequency spectrum is preferably stipulated such that the frequency spectrum has at least the signal level associated with two further discrete measurement frequencies that surround the intermodulation frequency.

Instead of a mere level measurement at the intermodulation frequency that is to be measured, i.e. at which only the PIM signal level is evaluated, as used in the prior art, the present case involves proposing a spectral analysis for which there is provision for considering the power density adjacent to the intermodulation frequency. This allows accuracy to be increased when recording the intermodulation signal level. Furthermore, conclusions about the plausibility of the measurement may optionally be possible.

Beside the discrete intermodulation frequency, the proposed frequency spectrum therefore extends to at least one, preferably at least two, further measurement frequencies. However, provision is preferably made for more than two further discrete measurement frequencies beside the intermodulation frequency, preferably more than ten, more than twenty, more than fifty, more than one hundred or even more discrete measurement frequencies. In principle, a high number of further discrete measurement frequencies beside the intermodulation frequency is advantageous for increasing the accuracy and for checking the plausibility of the intermodulation measurement. However, increasing the number of measurement frequencies also increases the computational complexity for generating the frequency spectrum, which is why a person skilled in the art should—depending on the application—preferably weigh up accuracy and computational complexity.

As a result of the analysis, or ascertainment of the intermodulation source, being performed in the frequency domain, or in the discrete frequency spectrum, and further discrete measurement frequencies beside the intermodulation frequency also being included in the frequency spectrum, interference on the transmission link that is not found directly at the intermodulation frequency is distributed over the further measurement frequencies, or does not coincide with a common, supposed intermodulation signal level. The proposed method can significantly increase the likelihood of actually obtaining only signal components associated with the intermodulation at the intermodulation frequency that is to be expected or to be examined.

The risk of detecting an intermodulation source that is not actually present or that is not relevant to the transmission link, but rather can only be attributed to other interference, for example injected inputs by mobile radio signals, is significantly reduced according to the invention.

The invention is therefore particularly advantageously suitable for intermodulation measurements for which interference sources, such as mobile radio signals, cannot be ruled out, as may be the case for measurements in the field, for example.

In one advantageous configuration of the invention, there can be provision for the first test signal to be supplied to the transmission link at a constant, first test signal frequency. The test signal frequency of the first test signal may also vary (e.g. as an "upsweep", "downsweep", or wobbled frequency) If necessary, however. A constant first test signal frequency is generally preferred, however.

There can be provision for the second test signal to be supplied to the transmission link at a constant or varying (e.g. as an "upsweep", "downsweep" or wobbled frequency), second test signal frequency.

The test signal frequencies of the test signals preferably differ. It is generally preferred if the first test signal frequency and the second test signal frequency are each constant.

There can optionally also be provision for the powers of the first test signal and/or the second test signal to be varied. The respective test signal power is preferably constant, however.

In one configuration of the invention, there can be provision for the first test signal and/or the second test signal to be signals that are constant over time (CW signals). The first test signal and/or the second test signal are preferably a narrowband signal, preferably a sinusoidal signal. In principle, there can be provision for any waveform, however.

In one configuration of the invention, there can moreover be provision for multiple individual intermodulation measurements to be performed sequentially in succession, for example at respective constant test signal frequencies.

According to one configuration of the invention, there can be provision for a fast Fourier transformation ("Fast Fourier Transform", FFT) to be used for calculating the discrete frequency spectrum.

The fast Fourier transformation is an efficient algorithm for calculating the discrete Fourier transformation, or for calculating the discrete frequency spectrum, which is why a fast Fourier transformation may be particularly well suited in the present instance. In principle, the discrete frequency spectrum can also be calculated in a different way, however.

According to one development of the invention, there can be provision for the resolution bandwidth (RBW) of the discrete frequency spectrum to be 100 Hz to 10 kHz.

The resolution bandwidth is preferably 500 Hz to 5 kHz, particularly preferably approximately 1 kHz.

In one development of the invention, there can be provision for the measurement frequency range analyzed in the discrete frequency spectrum to be 10 kHz to 100 kHz, preferably 20 kHz to 80 kHz, particularly preferably 30 kHz to 50 kHz, quite particularly preferably approximately 40 kHz.

Interference from external interference sources can be attributed primarily to mobile radios, as said interference can be supplied to the transmission link almost unimpeded (e.g. as a result of defective shielding action in the RF lines/RF parts in mobile radios in the direct surroundings, but also in particular as a result of the antenna provided for receiving the mobile radio signals if said antenna cannot be removed from the transmission link). It is therefore advantageous to include at least some of the frequency ranges from the relevant mobile radio standards in the frequency spectrum. In particular, there can be provision for the analyzed measurement frequency range to also comprise at least one carrier frequency spacing ("subcarrier") from a mobile radio standard. If applicable, there can even be provision for the analyzed measurement frequency range to the equivalent to at least the useful bandwidth from a mobile radio standard. The measurement frequency range can preferably be obtained from the intermodulation frequency as the center frequency, plus a bandwidth on either side for at least one frequency carrier spacing from the mobile radio standard relevant to the transmission link. In this way, any relevant mobile radio signal can be captured in the measurement frequency range and included in the evaluation, in order to prevent incorrect detection of an intermodulation source in the best way possible.

Possible mobile radio standards to be taken into account can conform to the standards 2G, 3G, 4G or 5G, for example, as GMSK, CDMA or OFDM with approximately 200 kHz to 4 MHz continuous spectrum or (at present) 15 kHz subcarrier spacing.

In one development of the invention, there can be provision for the intermodulation signal level associated with the third-order intermodulation frequency to be determined.

It has been found that in particular the third-order intermodulation product can interfere, since the applicable intermodulation frequency can fall within the bandwidth of the data signal (in particular mobile radio signal) modulated onto the carrier signal.

The third-order intermodulation frequency can be ascertained preferably by subtracting the test signal frequency of the second test signal from twice the test signal frequency of the first test signal. In principle, for calculating the intermodulation frequency, the aforementioned relationship $f_{IM}=m \cdot f_1 \pm n \cdot f_2$ can apply for the order (n+m), at constant test signal frequencies $f_1$, $f_2$.

In one advantageous development of the invention, there can be provision for the discrete intermodulation frequency to form the center frequency between the further discrete measurement frequencies in the discrete frequency spectrum.

In principle, the intermodulation frequency may also be offset from the center in the discrete frequency spectrum, however, for example if interference that is to be expected and that needs to be distinguished from the intermodulation source has an Increased effect in the low-frequency or high-frequency range in the transmission link. Generally, however, it makes sense to select the intermodulation frequency as the center frequency.

In one development of the invention, there can be provision for performing a plausibility check on the intermodulation measurement (preferably by means of a control device configured specifically for this purpose, for example the control device that will be mentioned herein) in order to evaluate whether the intermodulation signal level recorded in the discrete frequency spectrum can be attributed with sufficient plausibility to an intermodulation source in the transmission link rather than to other interference or injected input in the transmission link.

It is thus possible to ascertain whether or not the intermodulation measurement delivers a meaningful measurement result. Finally, the intermodulation measurement can be rejected, repeated or used to ascertain the intermodulation source on the basis of the plausibility.

A measurement that is to be rejected can be precluded from an automated further processing, for example, and/or displayed to an engineer as not sufficiently plausible, or erroneous, by way of interaction, for example by way of visual or graphical or other representation of the measurement. Accordingly, the measurement can be repeated in automated fashion if necessary or an engineer can be instructed to repeat the measurement.

This advantageously allows "false errors", or falsely detected intermodulation sources that are not actually present or are not present at the recorded intensity, to be precluded from further consideration. An involved or unnecessary search for the supposed (sporadic) intermodulation source can therefore be avoided.

There can be provision for the plausibility check to involve ascertaining a plausibility characteristic value in order to quantify the plausibility of the intermodulation measurement. The plausibility characteristic value can preferably be combined with the respective intermodulation measurement, for example the recorded intermodulation signal level. On the basis of the ascertained plausibility characteristic value, it is possible to decide for example whether the intermodulation measurement is rejected, repeated or considered valid. This decision can, in principle, also be left to an engineer performing the intermodulation measurement, for example by displaying the plausibility characteristic value to the engineer together with the result of the intermodulation measurement.

The plausibility of the intermodulation measurement, for example the advice to preclude or repeat a measurement, and if applicable also a representation of the aforementioned plausibility characteristic value, can be displayed during a conventional PIM evaluation (e.g. identification in the frequency sweep mode, in the time sweep mode and/or in the spectrogram sweep mode).

In one advantageous development of the invention, there can be provision for the plausibility check to involve the signal levels associated with some or all measurement frequencies in the discrete frequency spectrum being compared with the intermodulation signal level.

The plausibility of the intermodulation measurement preferably rises with the difference between the intermodulation signal level and the highest signal level associated with the measurement frequencies used for the plausibility check.

The difference between the intermodulation signal level and a signal level is intended to be understood within the context of the invention to mean the result of subtraction of the signal level from the intermodulation signal level. This difference may possibly also assume negative values if the intermodulation signal level is lower than the signal level used for the comparison, that is to say if an adjacent signal level surpasses the intermodulation signal level. This case generally leads to an implausible measurement result.

If adjacent spectral components (e.g. at the spacing 1 kHz to 15 kHz, depending on the mobile radio standard) contain an increased signal level (i.e. a detectable signal level above the noise), then this indicates an interference signal in the region of the intermodulation frequency. The level separation of the adjacent spectral components from the intermodulation frequency can be evaluated. If the level separation is small (e.g. <10 dB), the measurement signal is possibly already being distorted, with the result of increased uncertainty, or reduced plausibility. If the level separation is even smaller (e.g. <3 dB), the intermodulation signal is being very greatly distorted or is already drowned in the interfering noise—the measured value at this measurement frequency cannot then be determined clearly and is therefore possibly invalid, or implausible.

All further measurement frequencies in the discrete frequency spectrum are preferably used for comparing the respective signal levels thereof with the Intermodulation signal level. In this way, it is possible to ascertain whether there are, within the examined measurement frequency range, signal levels whose order of magnitude comes close to that of the Intermodulation signal level or possibly even surpasses it, which indicates interference or injected input in the transmission link and can thus reduce the plausibility of the intermodulation measurement.

In an advantageous development of the Invention, there can be provision for the plausibility of the Intermodulation measurement to be insufficient if the difference between the intermodulation signal level and at least one of the signal levels associated with the measurement frequencies used for the plausibility check falls short of a defined threshold value, in particular falls short of a threshold value between 3 dB and 10 dB.

If the recorded intermodulation signal level stands out clearly from the surrounding noise, the recording of the intermodulation source can be considered plausible (for example from a difference of 10 dB upward).

If the intermodulation signal level stands out from the adjacent power density, or from the adjacent signal levels, only insignificantly, the superimposed noise generally already distorts the measured value and at least one repetition of the intermodulation measurement may be appropriate.

If the intermodulation signal level does not set itself apart from the adjacent signal levels, the intermodulation source (if present in the first place) is covered by other interference or Injected input completely and the measurement can be rated as Inconclusive or implausible.

The difference between the intermodulation signal level and at least one of the signal levels associated with the further measurement frequencies being considered can preferably also be used to calculate the plausibility characteristic value.

In an advantageous development of the invention, there can be provision for at least the signal levels associated with the discrete measurement frequencies that are directly adjacent to the discrete intermodulation frequency in the discrete frequency spectrum to be used for the plausibility check.

Thus, at least the measurement frequencies directly beside the intermodulation frequency can preferably be used, if necessary also exclusively used, for the plausibility check. A series of measurement frequencies that is directly adjacent to the Intermodulation frequency (in particular on either side) can also be used for the plausibility check, for example in each case 2 to 100, 5 to 50 or 10 to 20 adjacent measurement frequencies on either side of the intermodulation frequency.

According to one development of the invention, there can be provision for the plausibility check to involve the signal levels associated with some or all measurement frequencies in the discrete frequency spectrum Initially being used to determine an average signal level, and said average signal level being compared with the intermodulation signal level, the plausibility of the intermodulation measurement rising with the difference between the intermodulation signal level and the average signal level.

In one development of the invention, there may possibly also be provision for a multilevel analysis approach, or a multilevel plausibility check, wherein initially a first, coarse window within the measurement frequency range is used to include many or all measurement frequencies and then, in the event of doubt, a second, narrower window is used to include fewer measurement frequencies.

There can thus be provision for reducing the size of the analysis range around the intermodulation frequency during the plausibility check.

In one development of the invention, there can be provision for the measurement of the output signal to be performed by means of a software defined radio (SDR).

The specific configuration of the measuring device is not necessarily relevant in principle, however. By way of example, there can also be provision for a heterodyne receiver, or superheterodyne receiver, with a downstream level meter (logarithmic detector, analog-to-digital converter or rectifier diode).

According to one development of the invention, there can be provision for a discrete model frequency spectrum to be calculated on the basis of a model of the transmission link and the supplied test signals, correlation of the discrete model frequency spectrum with the discrete frequency spectrum being used to determine a correlation coefficient. Finally, the correlation coefficient can be taken as a basis for ascertaining the similarity between the discrete model frequency spectrum and the discrete frequency spectrum, in order to infer the plausibility of the intermodulation measurement. As the disparity between the measured frequency spectrum and the expected model frequency spectrum increases, it can be assumed that the plausibility of the intermodulation measurement is decreasing.

The model frequency spectrum can be calculated for an intermodulation-free transmission link and/or a transmission link having a model intermodulation source and/or can be ascertained by concurrently supplying the test signals to a reference device under test (reference DUT) of the intermodulation-free transmission link, or of the model intermodulation source.

To this end, the excitation signal, in particular the two test signals, is preferably modulated (in each case with different frequencies). Suitable modulation methods can be any established single- and double-sideband modulation methods, such as for example amplitude modulation, frequency modulation, phase modulation, pulse amplitude modulation, pulse density modulation, pulse pause modulation or pulse frequency modulation.

It Is therefore advantageously possible to correlate the measured variable, that is to say the intermodulation signal level, out from the potentially noisy output signal despite interference or injected input.

The invention also relates to a computer program, comprising control commands that, when the program is executed by a control device, cause the latter to carry out the method according to the embodiments above and below.

The control device may be in the form of a microprocessor. Instead of a microprocessor, there can also be provision for any other device for implementing the control device, for example one or more arrangements of discrete electrical parts on a printed circuit board, a programmable logic controller (PLC), an application-specific integrated circuit (ASIC) or another programmable circuit, for example including a field programmable gate array (FPGA), a programmable logic array (PLA) and/or a commercially available computer.

The proposed computer program can advantageously facilitate detection and rating of interference during an intermodulation measurement. The actual measurement signal for ascertaining the intermodulation source can thereby advantageously be distinguished from interference signals.

Moreover, the invention also relates to an intermodulation measuring apparatus for ascertaining an intermodulation source by means of an intermodulation measurement in a transmission link, in particular for ascertaining a passive intermodulation source in a mobile radio transmission link.

The intermodulation measuring apparatus comprises a test signal generator having a first signal source for generating a first test signal and having a second signal source for generating a second test signal, the test signal generator being configured to supply the test signals to the transmission link simultaneously.

Moreover, the intermodulation measuring apparatus comprises a measuring device for measuring an output signal from the transmission link in response to the supplied test signals, and also a control device that is configured to analyze the output signal in a discrete frequency spectrum in order to determine the intermodulation signal level associated with a discrete intermodulation frequency. The measurement frequency range of the frequency spectrum is stipulated such that the frequency spectrum has at least the signal levels associated with two discrete measurement frequencies that surround the intermodulation frequency.

The proposed intermodulation measuring apparatus allows an intermodulation measurement to be performed even in the presence of superimposed interference, optionally while the plausibility of the measurement is evaluated.

Instead of a discrete or narrowband intermodulation measurement around the intermodulation frequency, the proposed intermodulation measuring apparatus can be used to perform a wideband measurement, with the result that at least two further measurement frequencies are recorded during a spectral analysis.

Features that have been described in association with one of the subjects of the invention, specifically provided by the invention's intermodulation measurement method, the computer program or the intermodulation measuring apparatus, are also advantageously implementable for the other subjects of the invention. Similarly, advantages that have been mentioned in association with one of the subjects of the invention can also be understood relative to the other subjects of the invention.

It should additionally be pointed out that terms such as "comprising", "having" or "with" do not exclude other features or steps. Furthermore, terms such as "a/an" or "the" Indicating steps or features in the singular do not exclude a plurality of features or steps—and vice versa.

It should be mentioned that labels such as "first" or "second", etc., are used primarily for reasons of distinguishability from respective apparatus or method features and are not necessarily intended to Indicate that features are mutually dependent or related to one another.

Furthermore, it should be emphasized that the values and parameters described in the present case concomitantly include deviations or variations of ±10% or less, preferably ±5% or less, more preferably ±1% or less, and very particularly preferably ±0.1% or less, of the value or parameter respectively mentioned, provided that these deviations are not excluded in practice in the implementation of the invention. The specification of ranges by way of start and end values also encompasses all those values and fractions that are included by the range respectively mentioned, in particular the start and end values and a respective average value.

The invention also relates to an alternative intermodulation measurement method, for ascertaining an intermodulation source by means of intermodulation measurement in a transmission link, in particular for ascertaining a passive intermodulation source in a mobile radio transmission link, having at least the following method steps: simultaneously supplying a first test signal and a second test signal to the transmission link, at least one of the test signals being modulated; measuring an output signal from the transmission link in response to the supplied test signals (preferably in the time domain, but optionally also in the frequency domain); ascertaining a model output signal on the basis of a model of the transmission link and the supplied test signals (preferably in the time domain, but optionally also in the frequency domain); and correlating the output signal with the model output signal to ascertain a correlation coefficient that is taken as a basis for ascertaining the similarity between the model output signal and the measured output signal, in order to infer the plausibility of the intermodulation measurement and/or the presence of the intermodulation source.

The model output signal can be calculated for an intermodulation-free transmission link and/or a transmission link having a model Intermodulation source and/or can be ascertained by concurrently supplying the test signals to a reference device under test (reference DUT) of the intermodulation-free transmission link, or of the model intermodulation source.

Furthermore, the invention also relates to a computer program, comprising control commands that, when the program is executed by a control device, cause the latter to carry out the aforementioned, alternative intermodulation measurement method.

Moreover, the invention relates, finally, to an alternative intermodulation measuring apparatus, for ascertaining an intermodulation source by means of intermodulation measurement in a transmission link, in particular for ascertaining a passive intermodulation source in a mobile radio transmission link, comprising a test signal generator having a first signal source for generating a first test signal and having a second signal source for generating a second test signal, the test signal generator being configured to modulate at least one of the test signals and to supply the test signals to the transmission link simultaneously, further comprising a measuring device for measuring an output signal from the transmission link in response to the supplied test signals (preferably in the time domain, but optionally also in the frequency domain), and further comprising a control device that is configured to ascertain a model output signal on the basis of a model of the transmission link and the supplied test signals (preferably in the time domain, but optionally also in the frequency domain) and to ascertain the intermodulation source by correlating said model output signal with the output signal in order to ascertain a correlation coefficient that is taken as a basis for ascertaining the similarity between the model output signal and the measured output signal, in order to infer the plausibility of the intermodulation measurement and the presence of the intermodulation source.

The features described in the present description relate to advantageous embodiments and variants of the alternative intermodulation measurement method, the alternative computer program and the alternative intermodulation measuring apparatus. The applicant reserves the right to claim said subjects separately if applicable.

Exemplary embodiments of the invention are described more thoroughly herein with reference to the figures.

The figures in each case show preferred exemplary embodiments in which individual features of the present invention are illustrated in combination with one another. Features of an exemplary embodiment are also able to be implemented independently of the other features of the same exemplary embodiment, and may readily be combined accordingly by a person skilled in the art to form further expedient combinations and sub-combinations with features of other exemplary embodiments.

SUMMARY

My intermodulation measurement method, intermodulation measuring apparatus and computer program for ascertaining an intermodulation source in a transmission link generally provides a measurement method and apparatus that facilitates reliable ascertainment of intermodulation sources in a transmission link with good distinguishability from other interference or superimpositions in the transmission link.

A principal aspect of the present invention is an intermodulation measurement method for ascertaining an intermodulation source (1) by means of intermodulation measurement in a transmission link (2), in particular for ascertaining a passive intermodulation source in a mobile radio transmission link, having at least the following method steps: simultaneously supplying a first test signal ($t_1$) and a second test signal ($t_2$) to the transmission link (2); and measuring an output signal (s) from the transmission link (2) in response to the supplied test signals ($t_1$, $t_2$), characterized in that the output signal (s) is analyzed in a discrete frequency spectrum (10) in order to determine the intermodulation signal level ($P_{PIM}$) at a discrete intermodulation frequency ($f_{PIM}$), the measurement frequency range (DM) of the frequency spectrum (10) being stipulated such that the frequency spectrum (10) has at least the signal level ($P_{0...n}$) associated with a further discrete measurement frequency ($f_{0...n}$).

A further aspect of the present invention is an intermodulation measurement method characterized in that the resolution bandwidth of the discrete frequency spectrum (10) is 100 Hz to 10 kHz, preferably 500 Hz to 5 kHz, particularly preferably 1 kHz.

A further aspect of the present invention is an intermodulation measurement method characterized in that the measurement frequency range (DM) analyzed in the discrete frequency spectrum (10) is 10 kHz to 100 kHz, preferably 20 kHz to 80 kHz, particularly preferably 30 kHz to 50 kHz, quite particularly preferably 40 kHz, and in particular comprises at least one carrier frequency spacing from a mobile radio standard.

A further aspect of the present invention is an intermodulation measurement method characterized in that the intermodulation signal level ($P_{PIM}$) associated with the third-order intermodulation frequency ($f_{PIM}$) is determined, in particular by subtracting the test signal frequency of the second test signal ($t_2$) from twice the test signal frequency of the first test signal ($t_1$).

A further aspect of the present invention is an intermodulation measurement method characterized in that the discrete intermodulation frequency ($f_{PIM}$) forms the center frequency between the further discrete measurement frequencies ($f_{0...n}$) in the discrete frequency spectrum (10).

A further aspect of the present invention is an intermodulation measurement method characterized in that a control device (11) is used to perform a plausibility check on the intermodulation measurement in order to evaluate whether the intermodulation signal level (PPM) recorded in the discrete frequency spectrum (10) can be attributed with sufficient plausibility to an intermodulation source (1) in the transmission link (2) rather than to other interference or Injected input in the transmission link (2), the intermodulation measurement being rejected, repeated or used to ascertain the intermodulation source (1) on the basis of the plausibility, preferably on the basis of a plausibility characteristic value (K) determined by the control device (11).

A further aspect of the present invention is an intermodulation measurement method characterized in that the plausibility check involves the signal levels ($P_{0...n}$) associated with some or all measurement frequencies ($f_{0...n}$) in the discrete frequency spectrum (10) being compared with the intermodulation signal level ($P_{PIM}$), the plausibility of the intermodulation measurement rising with the difference (DP) between the intermodulation signal level ($P_{PIM}$) and the highest signal level ($P_{0...n}$) associated with the measurement frequencies ($f_{0...n}$) used for the plausibility check.

A further aspect of the present invention is an intermodulation measurement method characterized in that the plausibility check Involves there being provision for an iterative analysis, in which initially a first, coarse window (13) is used to include the signal levels ($P_{0...n}$) associated with some or all measurement frequencies ($f_{0...n}$) in the discrete frequency spectrum (10) for the comparison with the intermodulation signal level ($P_{PIM}$), and there Is then provision for at least one second, narrower window (14) for including a subset of the measurement frequencies ($f_{0...n}$) taken into account in the first window (13).

A further aspect of the present invention is an intermodulation measurement method characterized in that the plausibility of the intermodulation measurement is insufficient if the difference (DP) between the intermodulation signal level ($P_{PIM}$) and at least one of the signal levels ($P_{0...n}$) associated with the measurement frequencies ($f_{0...n}$) used for the plausibility check falls short of a defined threshold value, in particular falls short of a threshold value between 3 dB and 10 dB.

A further aspect of the present invention is an intermodulation measurement method characterized in that at least the signal levels ($P_{0...n}$) associated with the discrete measurement frequencies ($f_{0...n}$) that are directly adjacent to the discrete intermodulation frequency ($f_{PIM}$) in the discrete frequency spectrum (10) are used for the plausibility check.

A further aspect of the present invention is an intermodulation measurement method characterized in that the plausibility check involves the signal levels ($P_{0...n}$) associated with some or all measurement frequencies ($f_{0...n}$) in the discrete frequency spectrum (10) initially being used to determine an average signal level ($P_m$), and said average signal level being compared with the intermodulation signal level ($P_{PIM}$), the plausibility of the intermodulation measurement rising with the difference (DP) between the intermodulation signal level ($P_{PIM}$) and the average signal level ($P_m$).

A further aspect of the present invention is an intermodulation measurement method characterized in that the output signal (s) is measured by means of a software defined radio.

A further aspect of the present invention is an intermodulation measurement method characterized in that a discrete model frequency spectrum is calculated on the basis of a model of the transmission link (2) and the supplied test signals ($t_1$, $t_2$), correlation of the discrete model frequency spectrum with the discrete frequency spectrum (10) being used to determine a correlation coefficient in order to take the correlation coefficient as a basis for ascertaining the similarity between the discrete model frequency spectrum and the discrete frequency spectrum (10), in order to infer the plausibility of the intermodulation measurement.

A still further aspect of the present invention is a computer program, comprising control commands that, when the program is executed by a control device (11), cause the latter to carry out the method described and disclosed herein.

An even still further aspect of the present invention is an intermodulation measuring apparatus (3) for ascertaining an intermodulation source (1) by means of intermodulation measurement in a transmission link (2), in particular for ascertaining a passive intermodulation source in a mobile radio transmission link, comprising a test signal generator (4) having a first signal source (5) for generating a first test signal ($t_1$) and having a second signal source (6) for generating a second test signal ($t_2$), the test signal generator (4) being configured to supply the test signals ($t_1$, $t_2$) to the transmission link (2) simultaneously, further comprising a measuring device (8) for measuring an output signal (s) from the transmission link (2) in response to the supplied test signals ($t_1$, $t_2$), characterized by a control device (11) that is configured to analyze the output signal (s) in a discrete frequency spectrum (10) in order to determine the intermodulation signal level ($P_{PIM}$) associated with a discrete intermodulation frequency ($f_{PIM}$), the measurement frequency range (DM) of the frequency spectrum (10) being stipulated such that the frequency spectrum (10) has at least the signal levels ($P_{0...n}$) associated with two discrete measurement frequencies ($f_{0...n}$) that surround the intermodulation frequency ($f_{PIM}$).

These and other aspects of the present invention are more fully set forth and disclosed herein.

BRIEF DESCRIPTIONS OF THE FIGURES

In the figures, functionally identical elements are provided with the same reference signs.

DETAILED WRITTEN DESCRIPTION OF THE PREFERRED EMBODIMENTS

This disclosure of the invention is submitted in furtherance of the Constitutional purposes of the US Patent Laws "to promote the progress of Science and the useful arts" (Article 1, Section 8).

Figure 1:
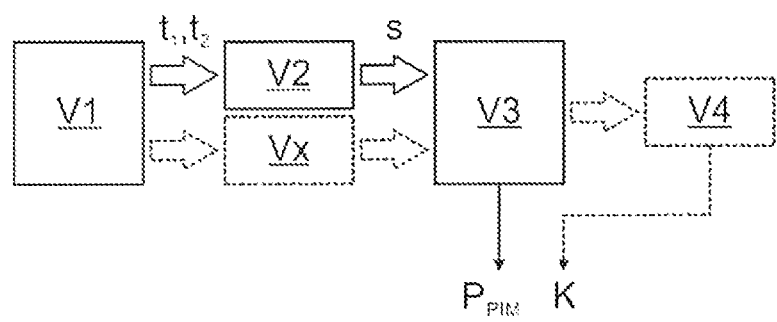
FIG. 1 shows an intermodulation measurement method according to an exemplary embodiment of the invention.
Figure 2:
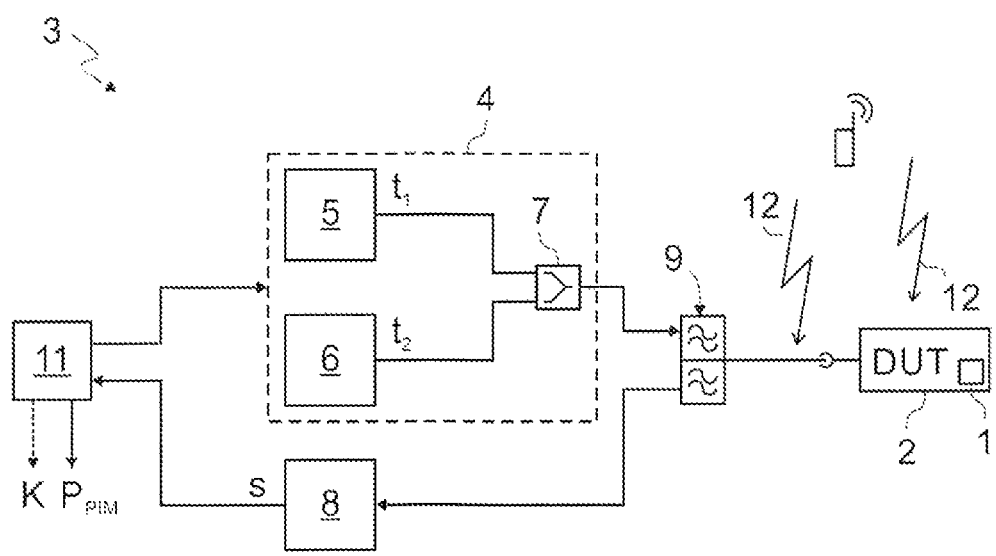
FIG. 2 shows an intermodulation measuring apparatus according to an exemplary embodiment of the invention.

FIG. 1 shows an intermodulation measurement method for ascertaining an intermodulation source 1 by means of intermodulation measurement in a transmission link 2; FIG. 2 shows a corresponding intermodulation measuring apparatus 3. The invention is particularly advantageously suitable for ascertaining a passive intermodulation source 1 in a mobile radio transmission link 2. The transmission link 2 to be checked ("device under test", DUT) can comprise one or more electronic components, such as for example antennas, plug connectors (in particular RF connectors), filters, electrical lines (in particular RF lines), passive devices, electrical loads or other components (not shown in the figures).

The method sequence described below for the intermodulation measurement method according to the invention is intended to be understood merely by way of illustration and without limitation. In particular, method steps can also be interchanged with one another, combined, replaced, deleted or complemented by other features. There can also be provision for optional, further method steps, even if this is not explicitly specified.

According to a first method step V1 of the intermodulation measurement method, a first test signal $t_1$ is supplied to the transmission link 2 simultaneously with a second test signal $t_2$. To this end, the intermodulation measuring apparatus 3, as indicated in FIG. 2, can comprise a test signal generator 4 having a first signal source 5 for generating the first test signal $t_1$ and having a second signal source 6 for generating the second test signal $t_2$, which are combined by means of a combiner 7, for example, and supplied to the transmission link 2 in combination, or simultaneously.

The test signals $t_1$, $t_2$ can be, in particular, sinusoidal signals at a preferably respectively constant test signal frequency. In principle, however, the test signals $t_1$, $t_2$ can also have varying test signal frequencies, for example for the correlation analysis that will be described below.

In a second method step V2, there can be provision for an output signal s from the transmission link 2 to be measured in response to the supplied test signals $t_1$, $t_2$ by means of a measuring device 8. As shown in FIG. 2, the test signal generator 4 and the measuring device 8 may be connected to the transmission link 2 together via a diplexer 9, for example. In principle, the output signals can be measured in any manner, preferably by means of a software defined radio.

In a third method step V3, there is provision for the previously measured output signal s to be analyzed in a discrete frequency spectrum 10. To this end, there can be provision for a control device 11, as indicated in FIG. 2. The analysis of the discrete frequency spectrum 10 allows an intermodulation signal level $P_{PIM}$ associated with a (in particular third-order) discrete intermodulation frequency $f_{PIM}$ to be determined. Various Illustrative discrete frequency spectra 10 during an illustrative analysis of an output signal s are schematically shown in FIGS. 3 to 8.

The discrete frequency spectrum 10 can preferably be calculated by means of a fast Fourier transformation (FFT). The resolution bandwidth of the frequency spectrum 10 can be for example 100 Hz to 10 kHz, preferably 500 Hz to 5 kHz, in particular 1 kHz.

Figure 3:
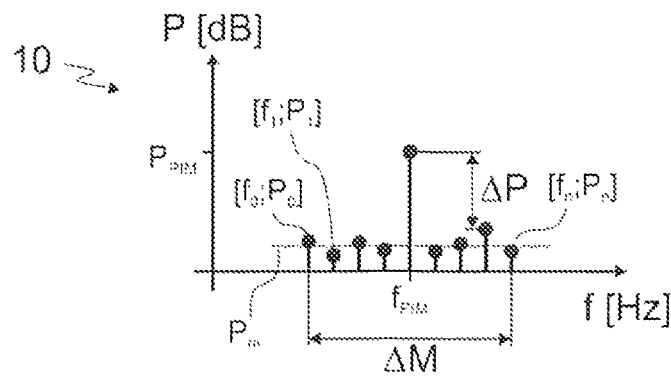
FIG. 3 shows an example of a respective discrete frequency spectrum during the analysis of the output signal.

It is proposed that the measurement frequency range DM of the frequency spectrum 10 be stipulated such that the frequency spectrum 10 preferably has at least the signal levels $P_{0...n}$ associated with two further discrete measurement frequencies $f_{0...n}$ that surround the intermodulation frequency $f_{PIM}$ (shown by way of example in FIG. 3).

The intermodulation frequency $f_{PIM}$ can be stipulated as the center frequency between the further discrete measurement frequencies $f_{0...n}$ in the discrete frequency spectrum 10. By way of illustration, the frequency spectrum 10 in FIG. 3 contains, beside the intermodulation frequency $f_{PIM}$, four respective further measurement frequencies on either side in the measurement frequency range DM, which, in principle, is Intended to be understood only to illustrate the relationships, however. In FIGS. 4 to 8 below, the further measurement frequencies $f_{0...n}$ are shown in simplified form and no longer separately with individual signal levels.

The measurement frequency range DM analyzed in the discrete frequency spectrum 10 is preferably stipulated as 10 kHz to 100 kHz, particularly preferably 40 kHz. In particular, there can be provision for the analyzed measurement frequency range DM to be equivalent to the useful bandwidth from a mobile radio standard that is relevant to the transmission link 2, with the result that all the mobile radio signals 12 are contained in the frequency spectrum 10, in order to render them distinguishable from the intermodulation frequency $f_{PIM}$.

During the analysis of the frequency spectrum 10, the intermodulation signal level $P_{PIM}$ at the envisaged intermodulation frequency $f_{PIM}$ is now preferably initially determined. Optionally, a plausibility check on the intermodulation measurement can then be performed in a fourth method step V4 in order to evaluate whether the intermodulation signal level $P_{PIM}$ recorded in the discrete frequency spectrum 10 can be attributed with sufficient plausibility to an intermodulation source 1 in the transmission link 2, rather than to other interference or injected input in the transmission link 2. On the basis of the plausibility, the intermodulation measurement can then be rejected, repeated or used to ascertain the intermodulation source 1.

The plausibility check will now be explained by way of Illustration and without limitation on the basis of FIGS. 3 to 8.

The plausibility check can involve there being provision for the signal levels $P_{0 \ldots n}$ associated with at least the further measurement frequencies $f_{0 \ldots n}$ directly adjacent to the intermodulation frequency $f_{PIM}$ in the discrete frequency spectrum 10 to be compared with the intermodulation signal levels $P_{PIM}$. The plausibility of the intermodulation measurement, for example a plausibility characteristic value K, rises with the difference DP between the intermodulation signal level $P_{PIM}$ and the highest signal level $P_{0 \ldots n}$ associated with the measurement frequencies $f_{0 \ldots n}$ used for the plausibility check.

Figure 4:
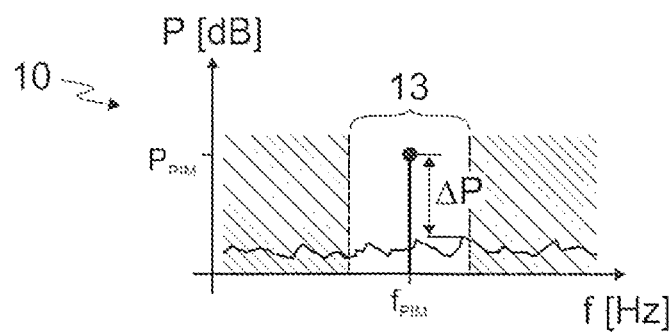
FIG. 4 shows a further example of a respective discrete frequency spectrum during the analysis of the output signal.

In FIGS. 3 and 4, the intermodulation signal level $P_{PIM}$ of the supposed intermodulation source 1 stands out clearly from the signal levels $P_{0 \ldots n}$ associated with the further measurement frequencies $f_{0 \ldots n}$, or from the noise, and can therefore be considered sufficiently plausible. It can be assumed in particular in FIGS. 3 and 4 that the recorded intermodulation signal level $P_{PIM}$ can actually be attributed to an intermodulation source 1 and not to an injected input, for example of a mobile radio signal 12.

Figure 5:
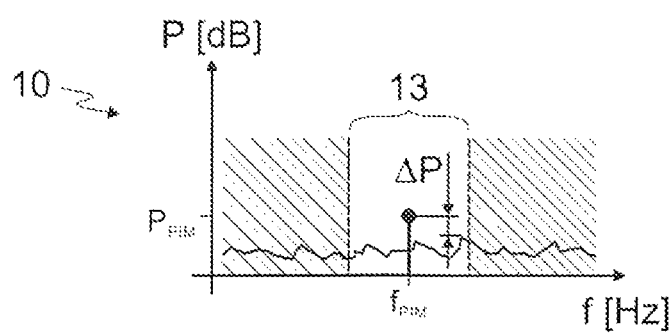
FIG. 5 shows a further example of a respective discrete frequency spectrum during the analysis of the output signal.

By contrast, the difference DP between the intermodulation signal level $P_{PIM}$ and the surrounding signal levels $P_{0 \ldots n}$ is much smaller in the case of the example shown in FIG. 5. An engineer may therefore be asked to reject or repeat the measurement.

As an alternative or in addition to a plausibility check on the basis of a direct level comparison, or the consideration of adjacent maxima, there can also be provision for the plausibility check to involve the signal levels $P_{0 \ldots n}$ associated with some or all measurement frequencies $f_{0 \ldots n}$ in the discrete frequency spectrum 10 initially being used to determine an average signal level $P_m$ (cf. FIG. 3), and said average signal level being compared with the intermodulation signal level $P_{PIM}$, the plausibility of the intermodulation measurement rising with the difference between the intermodulation signal level $P_{PIM}$ and the average signal level $P_m$.

There can be provision for a threshold value to be defined for the difference DP, the intermodulation measurement being identified as no longer sufficiently plausible if said threshold value is fallen short of (for example 3 dB to 10 dB).

Figure 6:
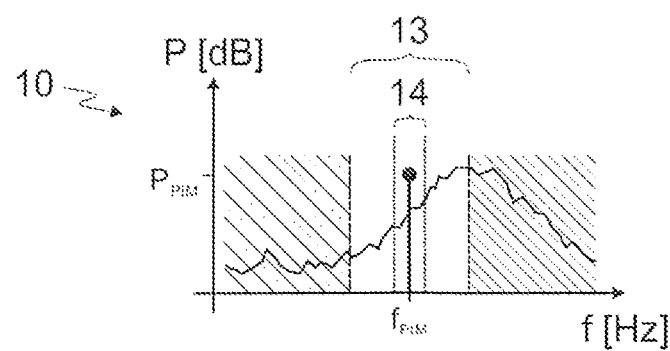
FIG. 6 shows a further example of a respective discrete frequency spectrum during the analysis of the output signal.

A further example of a discrete frequency spectrum 10 during an intermodulation measurement is shown in FIG. 6. The frequency spectrum 10 shown can be obtained for example when a GMSK or CDMA mobile radio signal 12 is Injected. In this case, the intermodulation signal level $P_{PIM}$ at the intermodulation frequency $f_{PIM}$ can definitely stand out from the surrounding measurement frequencies $f_{0 \ldots n}$, this being detectable around the intermodulation frequency $f_{PIM}$ only on closer consideration, however. When all measurement frequencies $f_{0 \ldots n}$ in the entire measurement frequency range DM are considered for the purpose of determining the difference DP, on the other hand, the result is an exclusion of the measurement. There may therefore optionally be provision for a multilevel analysis approach, wherein initially a first, coarser window 13 within the measurement frequency range DM and later, in the event of doubt, a second, narrower window 14 is used to include fewer measurement frequencies $f_{0 \ldots n}$. Sufficient plausibility for the measurement can therefore still be obtained in respect of the intermodulation measurement shown in FIG. 6, but optionally with the advice to repeat the measurement if possible, since an injected input has obviously taken place.

Figure 7:
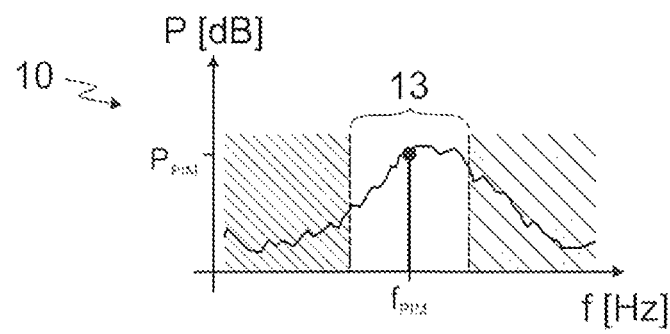
FIG. 7 shows a still further example of a respective discrete frequency spectrum during the analysis of the output signal.

A similar circumstance is shown in the frequency spectrum 10 in FIG. 7, wherein, in contrast to the previous example, a separately detectable intermodulation signal level $P_{PIM}$ can no longer be read off at the intermodulation frequency $f_{PIM}$, regardless of the window 13, 14 that is used. The intermodulation measurement shown in FIG. 7 would accordingly need to be rejected.

Figure 8:
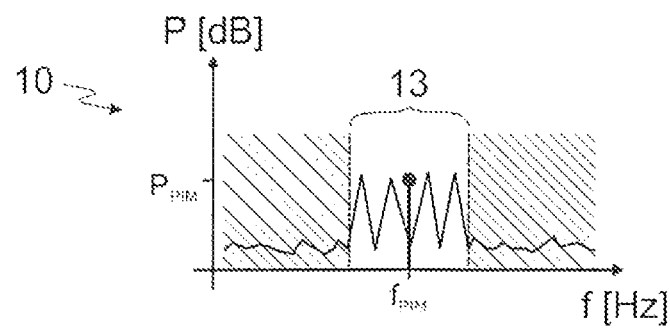
FIG. 8 shows an even still further example of a respective discrete frequency spectrum during the analysis of the output signal.

Finally, FIG. 8 shows a further frequency spectrum 10 for an intermodulation measurement into which a mobile radio signal 12 has been injected using the OFDM technique. Depending on the signal level associated with the intermodulation frequency $f_{PIM}$, an intermodulation source 1 cannot be reliably detected as a rule in this case, as it is not possible to rule out the detected intermodulation signal level $P_{PIM}$ at the intermodulation frequency $f_{PIM}$ not being equivalent to an adjacent maximum of the signal levels $P_{0 \ldots n}$. The detected signal level $P_{0 \ldots n}$ in FIG. 8 can presumably be attributed to an intermodulation source 1—due to the uncertainty, however, the intermodulation measurement would need to be repeated as a precaution.

In conclusion, it will be mentioned that the plausibility of the intermodulation measurement can also be determined by using an optional method step Vx (cf. FIG. 1) to calculate a discrete model frequency spectrum on the basis of a model of the transmission link 2 and the supplied test signals $t_1$, $t_2$, the test signals $t_1$, $t_2$ being modulated and correlation of the discrete model frequency spectrum with the discrete frequency spectrum 10 of the output signal s initially being used to determine a correlation coefficient. Finally, the correlation coefficient can be taken as a basis for ascertaining the similarity between the discrete model frequency spectrum and the discrete frequency spectrum, in order to infer the plausibility of the intermodulation measurement.

Similarly, a correlation can also be made in the time domain, in order to facilitate ascertainment of the intermodulation source 1, using an alternative Intermodulation measurement method, or an alternative Intermodulation measuring apparatus, a spectral analysis not being absolutely necessary for this case.

There can be provision for a computer program, comprising control commands that, when the program is executed by a control device, for example the control device 11 of the intermodulation measuring apparatus 3, cause the control device to carry out the method described above and below.

OPERATION

Having described the steps and structure of my Intermodulation Measurement Method, Intermodulation Measuring Apparatus and Computer Program for Ascertaining an Intermodulation Source in a Transmission Link, its operation is briefly described.

A principal object of the present invention is a method for ascertaining an intermodulation source (1) and for measuring intermodulation in a transmission link (2) comprising the steps: providing a transmission link (2); simultaneously supplying a first test signal ($t_1$) to the transmission link (2) and supplying a second test signal ($t_2$) to the transmission link (2); and measuring an output signal from the transmission link (2) in response to the simultaneous supplying of the first test signal ($t_1$) and the second test signal ($t_2$) to the transmission link (2); and analyzing the measured output signal in a discrete frequency spectrum (10) to determine an intermodulation signal level ($P_{PIM}$) at a discrete intermodulation frequency ($f_{PIM}$); and wherein a measurement frequency range (DM) of the discrete frequency spectrum (10) has at least a signal level ($P_{0...n}$) associated with a further discrete measurement frequency ($f_{0...n}$); and providing a control device (11) to perform a plausibility check on the intermodulation measurement to evaluate whether the determined intermodulation signal level ($P_{PIM}$) recorded in the discrete frequency spectrum (10) can be attributed to an intermodulation source (1) in the transmission link (2) rather than interference or injected Input in the transmission link (2); and wherein the intermodulation measurement is rejected, or repeated or used to ascertain the intermodulation source (1) in the transmission link on the basis of an outcome of the plausibility check as performed by the control device (11).

A further object of the present invention is a method for ascertaining an intermodulation source (1) and for measuring intermodulation in a transmission link (2) and wherein a resolution bandwidth of the discrete frequency spectrum (10) is between approximately 100 Hz and 10 kHz.

A further object of the present invention is a method for ascertaining an intermodulation source (1) and for measuring intermodulation in a transmission link (2) and wherein the measurement frequency range (DM) analyzed in the discrete frequency spectrum (10) is between approximately 10 kHz and 100 kHz; and comprises at least one carrier frequency spacing from a mobile radio standard.

A further object of the present invention is a method for ascertaining an intermodulation source (1) and for measuring intermodulation in a transmission link (2) and wherein the intermodulation signal level ($P_{PIM}$) associated with a third-order intermodulation frequency ($f_{PIM}$) is determined, by subtracting the test signal frequency of the second test signal ($t_2$) from twice the test signal frequency of the first test signal ($t_1$).

A further object of the present invention is a method for ascertaining an intermodulation source (1) and for measuring intermodulation in a transmission link (2) and wherein the discrete intermodulation frequency (fpm) forms a center frequency between the further discrete measurement frequencies ($f_{0...n}$) in the discrete frequency spectrum (10).

A further object of the present invention is a method for ascertaining an intermodulation source (1) and for measuring intermodulation in a transmission link (2) and wherein the plausibility check involves signal levels ($P_{0...n}$) associated with discrete measurement frequencies ($f_{0...n}$) in the discrete frequency spectrum (10) being compared with the intermodulation signal level ($P_{PIM}$); and wherein the plausibility of the intermodulation measurement rising with the difference (DP) between the intermodulation signal level ($P_{PIM}$) and the highest signal level ($P_{0...n}$) associated with the measurement frequencies ($f_{0...n}$) used for the plausibility check.

A further object of the present invention is a method for ascertaining an intermodulation source (1) and for measuring intermodulation in a transmission link (2) and wherein the plausibility check provides for an iterative analysis, in which initially a first, coarse window (13) is used to include the signal levels ($P_{0...n}$) associated with some or all further discrete measurement frequencies ($f_{0...n}$) in the discrete frequency spectrum (10) for the comparison with the intermodulation signal level ($P_{PIM}$); and there is then provision for at least one second, narrower window (14) for including a subset of the further discrete measurement frequencies ($f_{0...n}$) taken into account in the first window (13).

A further object of the present invention is a method for ascertaining an intermodulation source (1) and for measuring intermodulation in a transmission link (2) and wherein the plausibility of the intermodulation measurement is insufficient if the difference (DP) between the intermodulation signal level ($P_{PIM}$) and at least one of the signal levels ($P_{0...n}$) associated with the measurement frequencies ($f_{0...n}$) used for the plausibility check falls short of a defined threshold value.

A further object of the present invention is a method for ascertaining an Intermodulation source (1) and for measuring intermodulation in a transmission link (2) and wherein at least the signal levels ($P_{0...n}$) associated with the discrete measurement frequencies ($f_{0...n}$) that are directly adjacent to the discrete intermodulation frequency ($f_{PIM}$) in the discrete frequency spectrum (10) are used for the plausibility check.

A further object of the present invention is a method for ascertaining an intermodulation source (1) and for measuring intermodulation in a transmission link (2) and wherein the plausibility check involves the signal levels ($P_{0...n}$) associated with the further discrete measurement frequencies ($f_{0...n}$) in the discrete frequency spectrum (10) initially being used to determine an average signal level ($P_m$); and the average signal level ($P_m$) is compared with the intermodulation signal level ($P_{PIM}$); and the plausibility of the intermodulation measurement rises with the difference (DP) between the intermodulation signal level ($P_{PIM}$) and the average signal level ($P_m$).

A further object of the present invention is a method for ascertaining an intermodulation source (1) and for measuring intermodulation in a transmission link (2) and wherein the output signal is measured by means of a software defined radio.

A further object of the present invention is a method for ascertaining an intermodulation source (1) and for measuring intermodulation in a transmission link (2) and wherein a discrete model frequency spectrum is calculated on the basis of a model of the transmission link (2) and the simultaneously supplied first and second test signals ($t_1$, $t_2$), and correlation of the calculated discrete model frequency spectrum with the discrete frequency spectrum (10) being used to determine a correlation coefficient in order to take the correlation coefficient as a basis for ascertaining the similarity between the calculated discrete model frequency spectrum and the discrete frequency spectrum (10), in order to infer the plausibility of the intermodulation measurement.

A further object of the present invention is a computer program to carry out a method for ascertaining an intermodulation source (1) and for measuring intermodulation in a transmission link (2) comprising: a control device (11) for executing-control commands of the computer program; providing a transmission link (2); simultaneously supplying a first test signal ($t_1$) to the transmission link (2) and supplying a second test signal ($t_2$) to the transmission link (2); and measuring an output signal from the transmission link (2) in response to the simultaneous supplying of the first test signal ($t_1$) and the second test signal ($t_2$) to the transmission link (2); and analyzing the measured output signal in a discrete frequency spectrum (10) to determine an intermodulation signal level (PIM) at a discrete intermodulation frequency ($f_{PIM}$); and wherein a measurement frequency range (DM) of the discrete frequency spectrum (10) has at least a signal level ($P_{0...n}$) associated with a further discrete measurement frequency ($f_{0...n}$); and using the control device (11) to perform a plausibility check on the intermodulation measurement to evaluate whether the determined intermodulation signal level ($P_{PIM}$) recorded in the discrete frequency spectrum (10) can be attributed to an intermodulation source (1) in the transmission link (2) rather than interference or injected input in the transmission link (2); and wherein the intermodulation measurement is rejected, or repeated or used to ascertain the intermodulation source (1) in the transmission link on the basis of an outcome of the plausibility check as performed by the control device (11).

A further object of the present invention is an apparatus for ascertaining an intermodulation source (1) by measuring intermodulation in a transmission link (2), the apparatus comprising: a test signal generator (4) having a first signal source (5) for generating a first test signal ($t_1$) and having a second signal source (6) for generating a second test signal ($t_2$), and wherein the test signal generator (4) supplies the first and second test signals ($t_1$, $t_2$) to the transmission link (2) simultaneously; and a measuring device (8) for measuring an output signal from the transmission link (2) responsive to the simultaneously supplied first and second test signals ($t_1$, $t_2$); and a control device (11) that analyses the measured output signal in a discrete frequency spectrum (10) to determine an intermodulation signal level ($P_{PIM}$) associated with a discrete intermodulation frequency ($f_{PIM}$); and wherein a measurement frequency range (DM) of the discrete frequency spectrum (10) has at least signal levels ($P_{0...n}$) associated with two discrete measurement frequencies ($f_{0...n}$) that surround the discrete intermodulation frequency ($f_{PIM}$); and wherein the control device (11) performs a plausibility check on the intermodulation measurement to evaluate whether the determined intermodulation signal level ($P_{PIM}$) recorded in the discrete frequency spectrum (10) can be attributed to an intermodulation source (1) in the transmission link (2) rather than interference or injected input in the transmission link (2); and wherein the intermodulation measurement is rejected, or repeated or used to ascertain the intermodulation source (1) in the transmission link on the basis of an outcome of the plausibility check as performed by the control device (11).

A further object of the present invention is a method for ascertaining an intermodulation source and for measuring intermodulation in a transmission link (2) and wherein the intermodulation source is a passive intermodulation source; and the transmission link (2) is a mobile radio transmission link.

A further object of the present invention is a method for ascertaining an intermodulation source (1) and for measuring intermodulation in a transmission link (2) and wherein a resolution bandwidth of the discrete frequency spectrum (10) is 1 kHz.

A further object of the present invention is a method for ascertaining an intermodulation source (1) and for measuring intermodulation in a transmission link (2) as claimed in Claim 7 and wherein the plausibility of the intermodulation measurement is insufficient if the difference (DP) between the intermodulation signal level ($P_{PIM}$) and at least one of the signal levels ($P_{0...n}$) associated with the measurement frequencies ($f_{0...n}$) used for the plausibility check falls short of a threshold value between 3 dB and 10 dB.

A still further object of the present invention is an apparatus for ascertaining an intermodulation source (1) by measuring intermodulation in a transmission link (2) and wherein the intermodulation source is a passive intermodulation source; and the transmission link (2) is a mobile radio transmission link.

An even still further object of the present invention is a method for ascertaining an intermodulation source (1) and for measuring intermodulation in a transmission link (2) and wherein the outcome of the plausibility check as performed by the control device (11) is a plausibility characteristic value (K).

In compliance with the statute, the present invention has been described in language more or less specific, as to structural and methodical features. It is to be understood, however, that the invention is not limited to the specific features shown and described since the means herein disclosed comprise preferred forms of putting the invention into effect. The invention is, therefore, claimed in any of its forms or modifications within the proper scope of the appended claims appropriately Interpreted in accordance with the Doctrine of Equivalents.

The invention claimed is:

1. A method for ascertaining an intermodulation source (1) and for measuring intermodulation in a transmission link (2) associated with mobile radio engineering and communications engineering, the method comprising the steps:

providing a transmission link (2) which is a device under test (DUT);

simultaneously supplying a first test signal ($t_1$) to the transmission link (2) and supplying a second test signal ($t_2$) to the transmission link (2):

measuring an output signal(s) from the transmission link (2) in response to the simultaneous supplying of the first test signal ($t_1$) and the second test signal ($t_2$) to the transmission link (2); and analyzing the measured output signal(s) in a discrete frequency spectrum (10) to determine at least one intermodulation measurement each including an intermodulation signal level ($P_{PIM}$) at a discrete intermodulation frequency ($f_{PIM}$); and wherein a measurement frequency range (DM) of the discrete frequency spectrum (10) has at least a signal level ($P_{0...n}$) associated with a further discrete measurement frequency ($f_{0...n}$); and providing a control device (11) to perform a plausibility check on the at least one intermodulation measurement to evaluate whether the determined intermodulation signal level ($P_{PIM}$) recorded in the discrete frequency spectrum (10) can be attributed with sufficient plausibility to an intermodulation source (1) in the transmission link (2) that is under test; and wherein on the basis of the outcome of the plausibility check as performed by the control device (11), the at least one intermodulation measurement being used to ascertain the intermodulation source (1) in the transmission link (2).

2. The method for ascertaining an intermodulation source (1) and for measuring intermodulation in a transmission link (2) as claimed in claim 1 and wherein a resolution bandwidth of the discrete frequency spectrum (10) is between approximately 100 Hz and 10 KHz.

3. The method for ascertaining an intermodulation source (1) and for measuring intermodulation in a transmission link (2) as claimed in claim 1 and wherein the measurement frequency range (DM) analyzed in the discrete frequency spectrum (10) is between approximately 10 kHz and 100 kHz; and comprises at least one carrier frequency spacing from a mobile radio standard.

4. The method for ascertaining an intermodulation source (1) and for measuring intermodulation in a transmission link (2) as claimed in claim 1 and wherein the intermodulation signal level ($P_{PIM}$) associated with a third-order intermodulation frequency ($f_{PIM}$) is determined, by subtracting the test signal frequency of the second test signal ($t_2$) from twice the test signal frequency of the first test signal ($t_1$).

5. The method for ascertaining an intermodulation source (1) and for measuring intermodulation in a transmission link (2) as claimed in claim 1 and wherein the discrete intermodulation frequency ($f_{PIM}$) forms a center frequency between the further discrete measurement frequencies ($f_{0...n}$) in the discrete frequency spectrum (10).

6. The method for ascertaining an intermodulation source (1) and for measuring intermodulation in a transmission link (2) as claimed in claim 1 and wherein the plausibility check involves signal levels ($P_{0...n}$) associated with discrete measurement frequencies ($f_{0...n}$) in the discrete frequency spectrum (10) being compared with the intermodulation signal level ($P_{PIM}$); and wherein
the plausibility of the intermodulation measurement rising with the difference (DP) between the intermodulation signal level ($P_{PIM}$) and the highest signal level ($P_{0...n}$) associated with the measurement frequencies ($f_{0...n}$) used for the plausibility check.

7. The method for ascertaining an intermodulation source (1) and for measuring intermodulation in a transmission link (2) as claimed in claim 6 and wherein the plausibility check provides for an iterative analysis, in which initially a first, coarse window (13) is used to include the signal levels ($P_{0...n}$) associated with some or all further discrete measurement frequencies ($f_{0...n}$) in the discrete frequency spectrum (10) for the comparison with the intermodulation signal level ($P_{PIM}$); and
there is then provision for at least one second, narrower window (14) for including a subset of the further discrete measurement frequencies ($f_{0...n}$) taken into account in the first window (13).

8. The method for ascertaining an intermodulation source (1) and for measuring intermodulation in a transmission link (2) as claimed in claim 6 and wherein the plausibility of the intermodulation measurement is insufficient if the difference (DP) between the intermodulation signal level ($P_{PIM}$) and at least one of the signal levels ($P_{0...n}$) associated with the measurement frequencies ($f_{0...n}$) used for the plausibility check falls short of a defined threshold value.

9. The method for ascertaining an intermodulation source (1) and for measuring intermodulation in a transmission link (2) as claimed in claim 6 and wherein the plausibility of the intermodulation measurement is insufficient if the difference (DP) between the intermodulation signal level ($P_{PIM}$) and at least one of the signal levels ($P_{0...n}$) associated with the measurement frequencies ($f_{0...n}$) used for the plausibility check falls short of a threshold value between 3 dB and 10 dB.

10. The method for ascertaining an intermodulation source (1) and for measuring intermodulation in a transmission link (2) as claimed in claim 1 and wherein at least the signal levels ($P_{0...n}$) associated with the discrete measurement frequencies ($f_{0...n}$) that are directly adjacent to the discrete intermodulation frequency ($f_{PIM}$) in the discrete frequency spectrum (10) are used for the plausibility check.

11. The method for ascertaining an intermodulation source (1) and for measuring intermodulation in a transmission link (2) as claimed in claim 1 and wherein the plausibility check involves the signal levels ($P_{0...n}$) associated with the further discrete measurement frequencies ($f_{0...n}$) in the discrete frequency spectrum (10) initially being used to determine an average signal level ($P_m$); and
the average signal level ($P_m$) is compared with the intermodulation signal level ($P_{PIM}$); and
the plausibility of the intermodulation measurement rises with the difference (DP) between the intermodulation signal level ($P_{PIM}$) and the average signal level ($P_m$).

12. The method for ascertaining an intermodulation source (1) and for measuring intermodulation in a transmission link (2) as claimed in claim 1 and wherein the output signal(s) is measured by means of a software defined radio.

13. The method for ascertaining an intermodulation source (1) and for measuring intermodulation in a transmission link (2) as claimed in claim 1 and wherein a discrete model frequency spectrum is calculated on the basis of a model of the transmission link (2) and the simultaneously supplied first and second test signals ($t_1$, $t_2$), and correlation of the calculated discrete model frequency spectrum with the discrete frequency spectrum (10) being used to determine a correlation coefficient in order to take the correlation coefficient as a basis for ascertaining the similarity between the calculated discrete model frequency spectrum and the discrete frequency spectrum (10), in order to infer the plausibility of the intermodulation measurement.

14. The method for ascertaining an intermodulation source and for measuring intermodulation in a transmission link as claimed in claim 1 and wherein the intermodulation source is a passive intermodulation source; and
the transmission link is a mobile radio transmission link.

15. The method for ascertaining an intermodulation source (1) and for measuring intermodulation in a transmission link (2) as claimed in claim 1 and wherein a resolution bandwidth of the discrete frequency spectrum (10) is 1 kHz.

16. The method for ascertaining an intermodulation source (1) and for measuring intermodulation in a transmission link (2) as claimed in claim 1 and wherein the outcome of the plausibility check as performed by the control device (11) is a plausibility characteristic value (K).

17. A non-transitory computer readable medium including a computer program that is executable by a control device (11) to carry out control commands for a method for ascertaining an intermodulation source (1) and for measuring intermodulation in a transmission link (2) associated with mobile radio engineering and communications engineering, the method comprising:
providing a transmission link (2) which is a device under test (DUT);
simultaneously supplying a first test signal ($t_1$) to the transmission link (2) and supplying a second test signal ($t_2$) to the transmission link (2):
measuring an output signal(s) from the transmission link (2) in response to the simultaneous supplying of the first test signal ($t_1$) and the second test signal ($t_2$) to the transmission link (2); and
analyzing the measured output signal(s) in a discrete frequency spectrum (10) to determine at least one intermodulation measurement each including an intermodulation signal level ($P_{PIM}$) at a discrete intermodulation frequency ($f_{PIM}$); and wherein
a measurement frequency range (DM) of the discrete frequency spectrum (10) has at least a signal level ($P_{0...n}$) associated with a further discrete measurement frequency ($f_{0...n}$); and
performing a plausibility check on the at least one intermodulation measurement to evaluate whether the determined intermodulation signal level ($P_{PIM}$) recorded in the discrete frequency spectrum (10) can be attributed with sufficient plausibility to an intermodulation source (1) in the transmission link (2) that is under test; and wherein
on the basis of the outcome of the plausibility check as performed by the control device (11), the at least one intermodulation measurement being used to ascertain the intermodulation source (1) in the transmission link (2).

18. An apparatus for ascertaining an intermodulation source (1) by measuring intermodulation in a transmission link (2) associated with mobile radio engineering and communications engineering, the apparatus comprising:
- a test signal generator (4) having a first signal source (5) for generating a first test signal ($t_1$) and having a second signal source (6) for generating a second test signal ($t_2$), and wherein the test signal generator (4) supplies the first and second test signals ($t_1$, $t_2$) to the transmission link (2) simultaneously; and
- a measuring device (8) for measuring an output signal(s) from the transmission link (2) responsive to the simultaneously supplied first and second test signals ($t_1$, $t_2$); and
- a control device (11) that analyses the measured output signal(s) in a discrete frequency spectrum (10) to determine at least one intermodulation measurement each including an intermodulation signal level ($P_{PIM}$) associated with a discrete intermodulation frequency ($f_{PIM}$); and wherein a measurement frequency range (DM) of the discrete frequency spectrum (10) has at least signal levels ($P_{0 \ldots n}$) associated with two discrete measurement frequencies ($f_{0 \ldots n}$) that surround the discrete intermodulation frequency ($f_{PIM}$); and wherein the control device (11) performs a plausibility check on the at least one intermodulation measurement to evaluate whether the determined intermodulation signal level (PPM) recorded in the discrete frequency spectrum (10) can be attributed with sufficient plausibility to an intermodulation source (1) in the transmission link (2) that is under test; and wherein on the basis of the outcome of the plausibility check as performed by the control device (11), the at least one intermodulation measurement being used to ascertain the intermodulation source (1) in the transmission link (2).

19. The apparatus for ascertaining an intermodulation source (1) by measuring intermodulation in a transmission link (2), as claimed in claim 18 and wherein the intermodulation source is a passive intermodulation source; and the transmission link is a mobile radio transmission link.

* * * * *